(12) United States Patent
Leskosek (10) Patent No.: US 9,370,087 B2
(45) Date of Patent: Jun. 14, 2016

(54) PLASMA GATE

(71) Applicant: James Andrew Leskosek, Summerland (CA)

(72) Inventor: James Andrew Leskosek, Summerland (CA)

( * ) Notice: Subject to any disclaimer, the term of this patent is extended or adjusted under 35 U.S.C. 154(b) by 0 days.

(21) Appl. No.: 14/442,375

(22) PCT Filed: Nov. 15, 2012

(86) PCT No.: PCT/CA2012/001057
§ 371 (c)(1),
(2) Date: May 12, 2015

(87) PCT Pub. No.: WO2014/075163
PCT Pub. Date: May 22, 2014

(65) Prior Publication Data
US 2015/0342017 A1 Nov. 26, 2015

(51) Int. Cl.
| H05H 1/16 | (2006.01) |
| H05H 1/00 | (2006.01) |
| H05H 1/52 | (2006.01) |
| H03K 17/00 | (2006.01) |
| H03K 17/52 | (2006.01) |

(52) U.S. Cl.
CPC .............. *H05H 1/16* (2013.01); *H03K 17/007* (2013.01); *H03K 17/52* (2013.01); *H05H 1/00* (2013.01); *H05H 1/52* (2013.01)

(58) Field of Classification Search
CPC ............ H05H 1/00; H05H 1/16; H03K 17/52
See application file for complete search history.

(56) References Cited

U.S. PATENT DOCUMENTS

| 5,151,663 A * | 9/1992 | Harvey | H03F 21/00 |
| | | | 315/111.21 |
| 5,653,811 A * | 8/1997 | Chan | H01J 37/20 |
| | | | 118/723 I |
| 5,958,157 A | 9/1999 | Crow | |
| 6,304,042 B1 * | 10/2001 | Savage | H01J 17/14 |
| | | | 315/111.41 |
| 6,414,803 B1 | 7/2002 | Pan | |
| 6,765,466 B2 | 7/2004 | Miyata | |
| 7,634,042 B2 * | 12/2009 | Auchterlonie | H02J 4/00 |
| | | | 315/111.41 |

* cited by examiner

*Primary Examiner* — Douglas W Owens
*Assistant Examiner* — Pedro C Fernandez
(74) *Attorney, Agent, or Firm* — Antony C. Edwards (57) ABSTRACT

A plasma gate includes at least one conductive input line having a corresponding at least one terminal end, a plurality of conductive output lines having a corresponding plurality of input ends, and a plasma gap having opposite first and second ends, where the plasma gap extends between the terminal ends of the input lines and the input ends of the output lines. A plasma-generating gas is resident in the plasma gap. At least one field generator having a field-generating distal end is mounted so as to position the distal end of the field generator adjacent the plasma gap. The output lines are arrayed along the plasma gap in a spaced apart array. The distal end of the field generator is positioned at least at the first end of the plasma gap.

19 Claims, 10 Drawing Sheets

PLASMA GATE

FIELD OF THE INVENTION

This invention relates to the field of non-mechanical switches employing a charged gas as the switching medium and in particular to a plasma gate employing a generated-field biased plasma bridge for controlled electrical and data connections through a gate system.

BACKGROUND OF THE INVENTION

In today's electronics market, the demand is for faster, simpler, and smaller electronic components. There is also a demand for the equivalent of component redundancy so as to avoid catastrophic failure due to the failure of a single component. Consequently, it is one object of the present invention to provide a method and apparatus for selectively controlling multiple electronic connections through a single junction point.

In the prior art applicant is not aware of any prior art more relevant than the following United States patents which only tangentially touch on limited aspects of the present invention, and in particular:

U.S. Pat. No. 5,958,157 which issued Sep. 28, 1999 to Crow et al. for a Magnetic Multiple Redirector of Moving Plasmas wherein moving plasma streams are redirected using a multiple array of magnetic field generators wherein alternate rows of the array have opposites magnetic field directions.

U.S. Pat. No. 6,765,466 which issued Jul. 20, 2004 to Miyata for a Magnetic Field Generator for Magnetron Plasma wherein a magnetic field generator is used for confining plasma within a vacuum chamber.

SUMMARY OF THE INVENTION

In summary, the plasma gate described herein may be characterized in one aspect as including at least one conductive input line having a corresponding at least one terminal end, a plurality of conductive output lines having a corresponding plurality of input ends, and a plasma gap having opposite first and second ends, where the plasma gap extends between the terminal ends of the input lines and the input ends of the output lines. A plasma-generating gas is resident in the plasma gap. At least one field generator having a field-generating distal end is mounted so as to position the distal end of the field generator adjacent the plasma gap. The output lines are arrayed along the plasma gap in a spaced apart array. The distal end of the field generator is positioned at least at the first end of the plasma gap.

In a preferred embodiment the plasma gap is elongate and may be substantially linear, and wherein the input line is an array of input lines. Consequently the at least one terminal end is a corresponding array of terminal ends corresponding to said array of conductive input lines. The plurality of input ends correspond to, and are substantially aligned with, the array of terminal ends. In one embodiment the plasma gap has a lateral width dimension which is constant, and another embodiment where it is not constant. For example the plasma gap may diverge or converge. In the case where the at least one field generator is a single generator field positioned at a first end of the plasma gap, the plasma gap may diverge or converge so as to diverge or converge respectively from the first end to the second end of the plasma gap.

In a further embodiment the at least one field generator includes a pair of field generators in opposed facing relation at the opposite ends of the plasma gap. The pair of field generators may be substantially parallel.

Where the at least one conductive input line is an array of conductive input lines, the at least one terminal end is a corresponding array of terminal ends corresponding to the array of conductive input lines. Preferably the plurality of input ends correspond to, and are substantially aligned with, the array of terminal ends.

The plasma gap may be configured so that it has a center-line extending substantially equidistant between the terminal ends and the input ends. In one embodiment the distal end of at least one field generator is angled relative to the gap center-line. The distal end may be offset from the center-line.

In a plasma gating method employing embodiments summarized above, the method includes the steps of:
 a) providing at least one conductive input line having a corresponding at least one terminal end,
 b) providing a plurality of conductive output lines having a corresponding plurality of input ends,
 c) providing a plasma gap having opposite first and second ends, the plasma gap extending between the at least one terminal end and the plurality of input ends, and providing a plasma-generating gas in the plasma gap,
 d) providing at least one field generator having a field-generating distal end mounted so as to position the distal end adjacent the plasma gap,
   wherein said plurality of conductive output lines are arrayed along the plasma gap in a spaced apart array, and the distal end is positioned at least at the first end of the plasma gap,
 e) selectively creating a plasma arc across the plasma gap from the at least one terminal end to the plurality of input ends,
 f) creating a field from the at least one field generator,
 g) controlling the field so as to control a position of the plasma arc.

DETAILED DESCRIPTION OF EMBODIMENTS OF THE INVENTION

Figure 1:
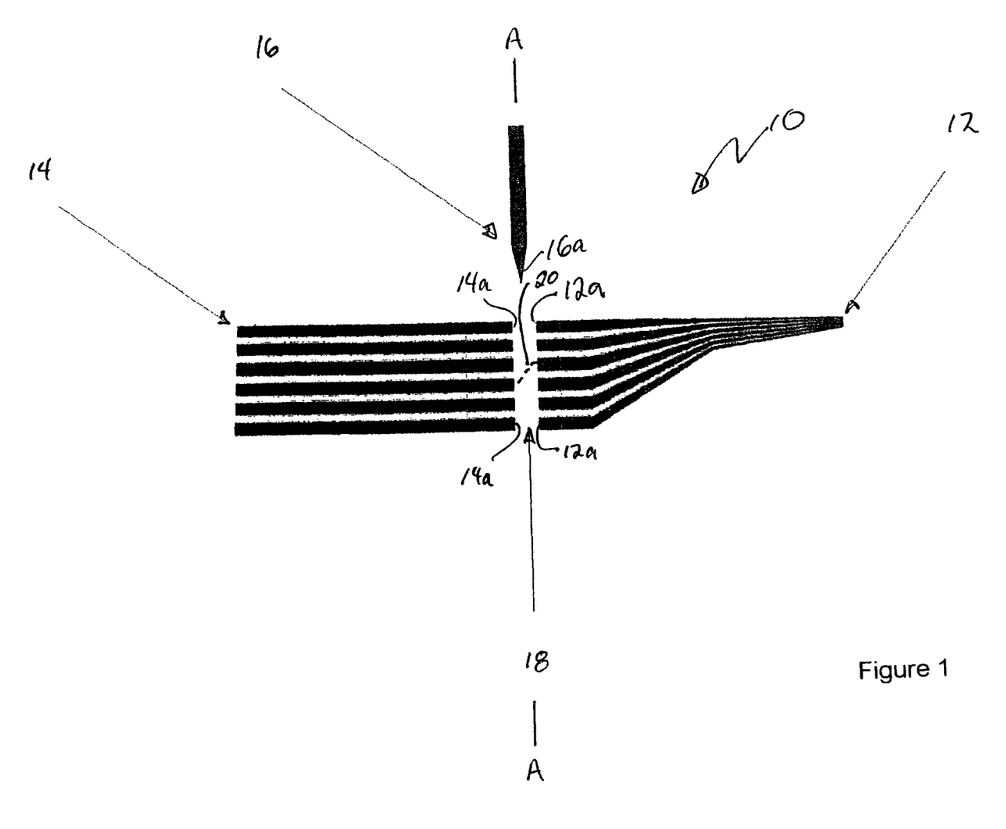
FIG. 1 is a diagrammatic plan view of a junction in a circuit employing one embodiment of a plasma gate.
Figure 1A:
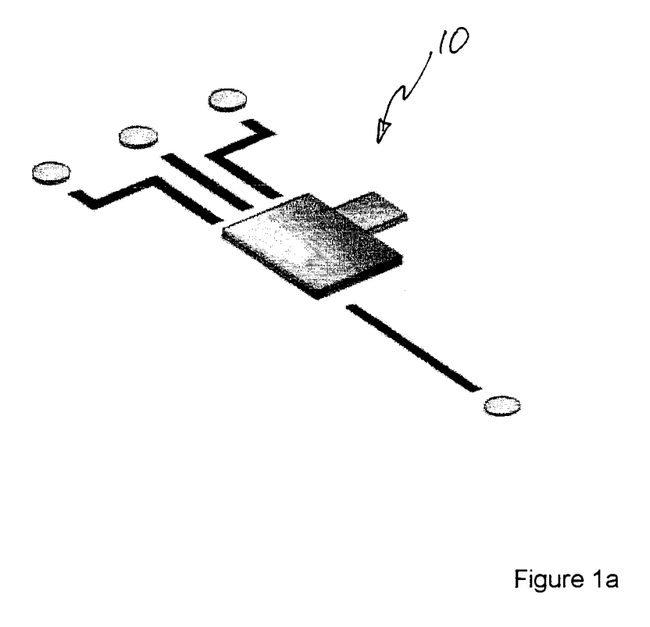
FIG. 1a is, in perspective view, the junction of FIG. 1 as it may look on a circuit board.
Figure 1B:
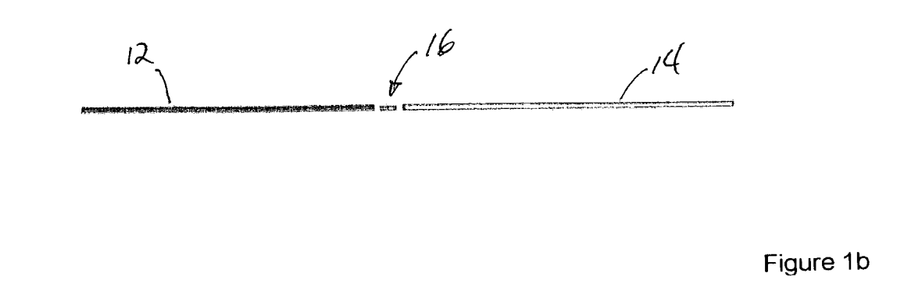
FIG. 1b is the circuit junction of FIG. 1 in front view showing the field generator lying in the plane of the inputs and output of the circuit junction.

As seen in the accompanying figures wherein like reference numerals denote corresponding parts in each view, junction 10, which may for example appear on a circuit board as the junction illustrated in FIG. 1a, includes at least one electrically conductive input line 12, wherein each input line 12 has a corresponding terminal end 12a, a plurality of electrically conductive output lines 14, each having a corresponding input end 14a, and a field generator 16 having a distal end 16a positioned adjacent a plasma gap 18 between terminal ends 12a and input ends 14a. Thus a single or multiple signal paths come into junction 10 on input line(s) 12, and by selectively positioning a plasma arc or bridge 20 across plasma gap 18, the signals are directed to a desired output path 14. Thus by selectively positioning the plasma arc bridging across gap 18 by the use of field generator 16, discreet input lines 12 as applicable and discreet output lines 14 may be selected for any particular signal. The term signal as used herein is intended to mean, and without intending to be limiting, electrical power and correspondingly transmitted data, whether analog or digital. As uses herein the term digital data is not intended to be restricted to binary data.

Testing was initially done in an electron chamber using a neon gas as the plasma gas within the chamber and using an alternating current power source. Experimentation was also done using a direct current power source and using ambient air instead of neon gas. Further experiments confirmed that data from a micro controller (not shown) could be sent and received across a plasma gate substantially as described herein. Thus for example in FIG. 4, an elongate, pointed, electrically conductive object, such as a metal nail or spike was successfully employed as a field generator 16. Field generator 16 was positively charged, and in the experiment of FIG. 4, the distal end 16a of the field generator was angled so that the point was off to the side of plasma gap 18, that is, offset laterally relative to a centroidal axis A, wherein axis A is substantially centroidally aligned along and through plasma gap 18. Plasma gap 18 runs between an opposed-facing pair of substantially parallel arrays of electrical connection points.

With respect to the embodiments of FIGS. 1-4, which not intended to be limiting, with field generator 16 positioned to place distal end 16a adjacent one end of plasma gap 18, producing a negative field from field generator 16 repulses or otherwise causes to move away plasma arc or bridge 20, shown by way of example in dotted outline in FIG. 1, from the negative field of the field generator.

It was found advantageous in controlling multiple connections through one junction point to have the positive circuit, for example input line 12, have multiple connection points at ends 12a so as to match the opposing negative electrical connections of ends 14a across plasma gap 18. Proper spacing of ends 12a from ends 14a, that is, the spacing between the negative and the positive electrical connections on each side of plasma gap 18, was adjusted so that only one plasma bridge 20 crossed gap 18 when the circuit was energized. The positioning of plasma bridge 20 was accomplished using either a negative or a positive field from field generator 16. Thus when a negative field was generated, the plasma bridge 20 moved away from the negative field generator. With the field turned off the position of the plasma bridge (or arc) 20 was stable and did not move along gap 18. Although not intended to be limited to any particular theory of operation, it is postulated that in this instance the resistance in the first electrical connection has been increased so that the plasma bridge 20 will move to the next path of least resistance in a direction away from the field generator. Conversely, the use of a positive field from field generator 16, attracts plasma bridge 20 so as to connect to an electrical connection closer to field generator 16. Thus manipulating the polarity and strength of the field from field generator 16, allows the controlled switching of plasma bridge 20 along the array or arrays of electrical connections along plasma gap 18.

Figure 2:
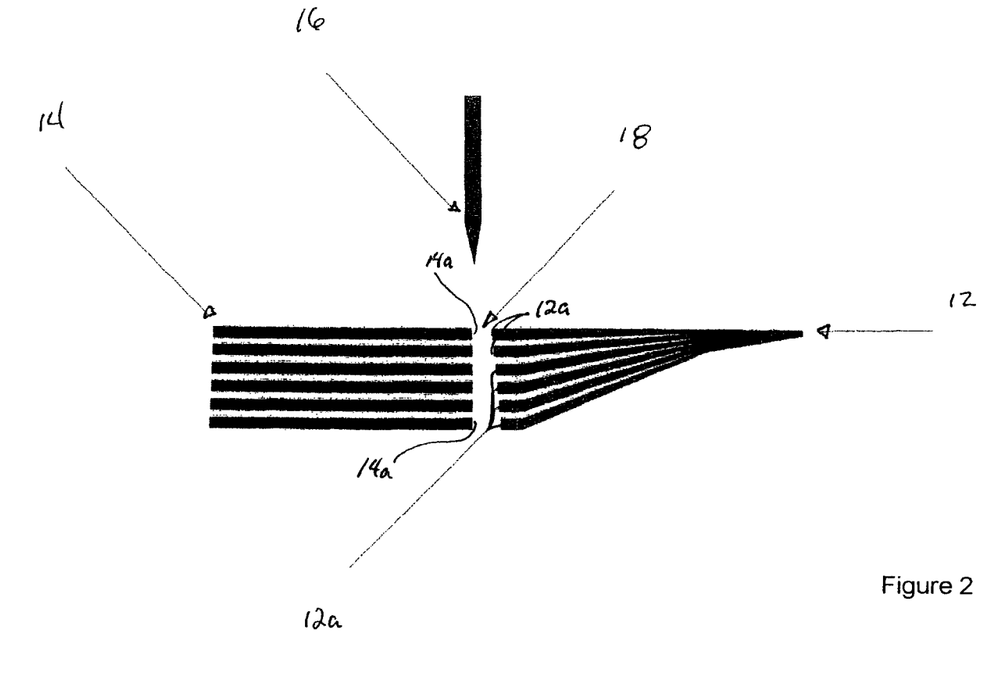
FIG. 2 is a diagrammatic view of a junction in a circuit employing a second embodiment of a plasma gate.
Figure 8:
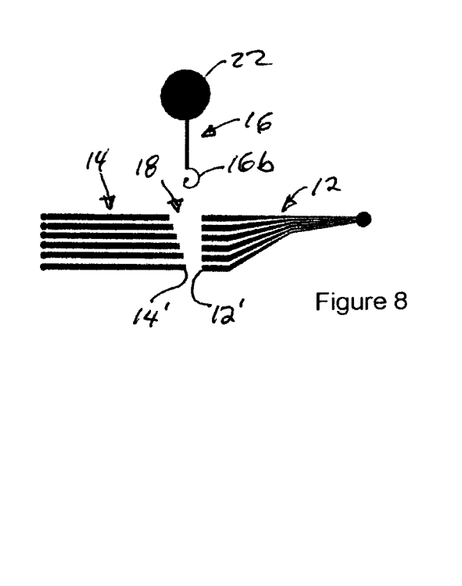
FIG. 8 is a further embodiment of a plasma gate having an energy burst device driving a field generator, wherein the field generator includes a coil.

In the embodiment of FIG. 2, the lateral spacing between ends 12a and ends 14a is increased, that is plasma gap 18 diverges as the distance increases from field generator 16 along plasma gap 18. This makes a variable distance between the positive and negative connection points across plasma gap 18. Plasma gap 18 diverges in FIG. 2 and converges in FIG. 8, although this is not intended to be limited. Using the configurations of FIG. 2 or 8 it is postulated that the position of plasma bridge 20 may be better controlled because the current will go to the closest spaced connection, because of the least resistance, until a field from field generator 16 pushes plasma bridge 20 away or pulls bridge 20 towards field generator 16 so as to move bridge 20 further away along the arrays of connection points or closer in along the arrays of connection points. However, when no field is being generated by field generator 16, plasma bridge 20 will return to its original position between the laterally closest spaced connection points on ends 12a and 14a, that is, which are closest to each other across plasma gap 18. Thus in the illustration of FIG. 2, which is not intended to be limiting, the return or original position of plasma bridge 20 is the opposed-facing pair of connection points closest to field generator 16. In FIG. 8 it is the pair of connection points furthest from field generator 16.

Figure 3:
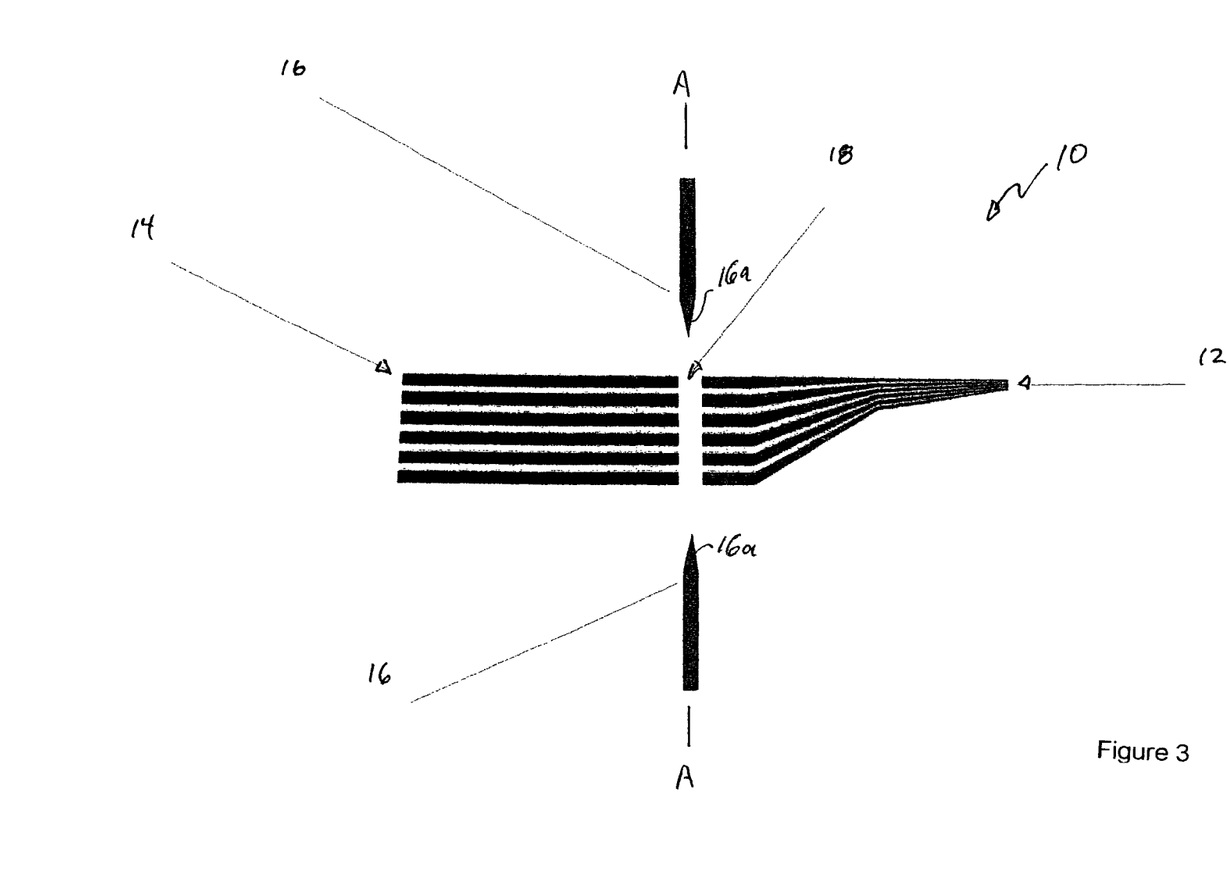
FIG. 3 is a diagrammatic view of a junction in a circuit employing a third embodiment of a plasma gate.

In the embodiment of FIG. 3, an opposed-facing, aligned pair of field generators 16 are positioned on centroidal axis A, with their corresponding distal ends 16a directed into plasma gap 18. It is postulated that this results in more control of the circuit switching as the stability of the position of plasma bridge 20 along plasma gap 18 may be improved so that the connected circuits may be stably held in place and when desired moved along plasma gap 18 with a stationary power factor.

Figure 4:
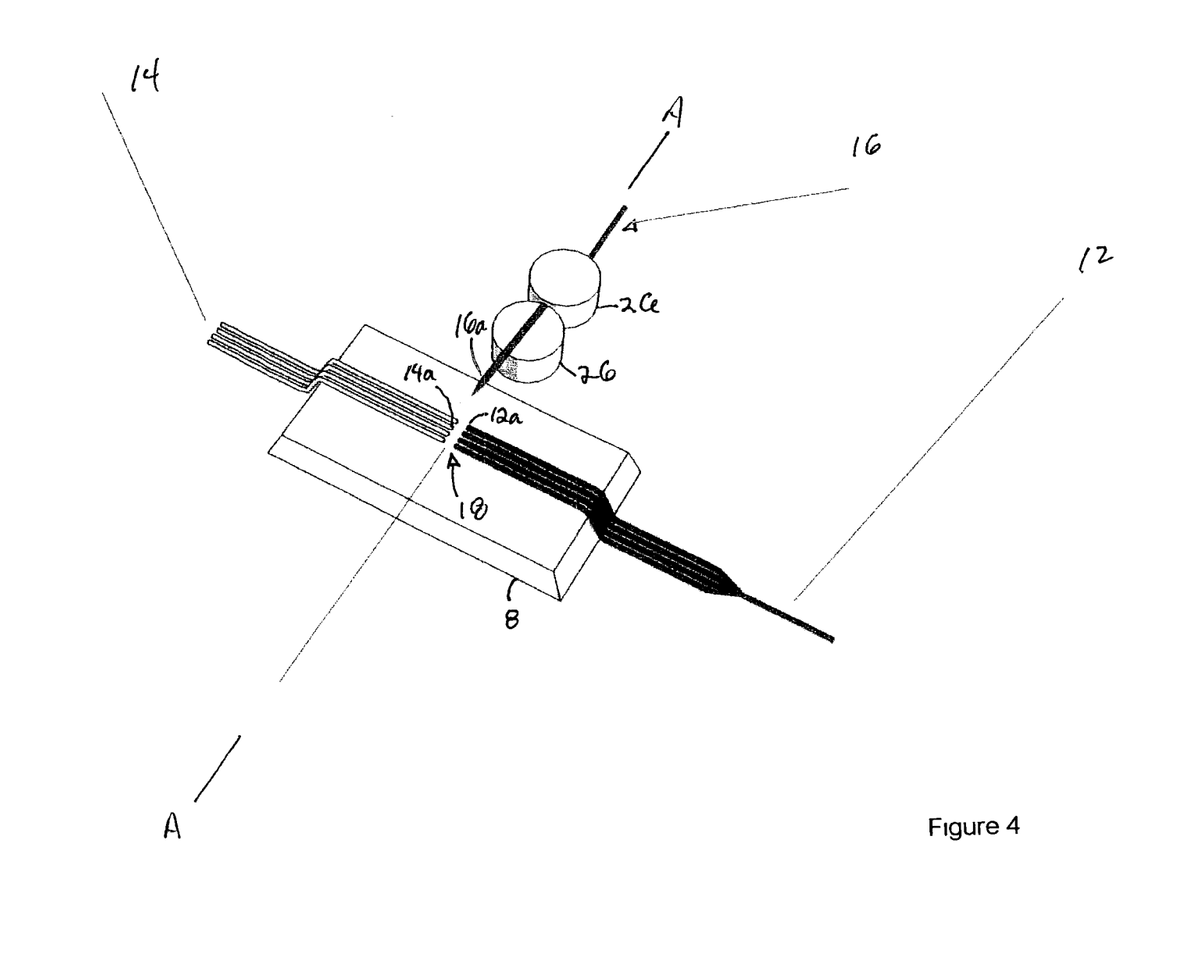
FIG. 4 is a diagrammatic view of a junction in a circuit employing a fourth embodiment of a plasma gate.
Figure 4A:
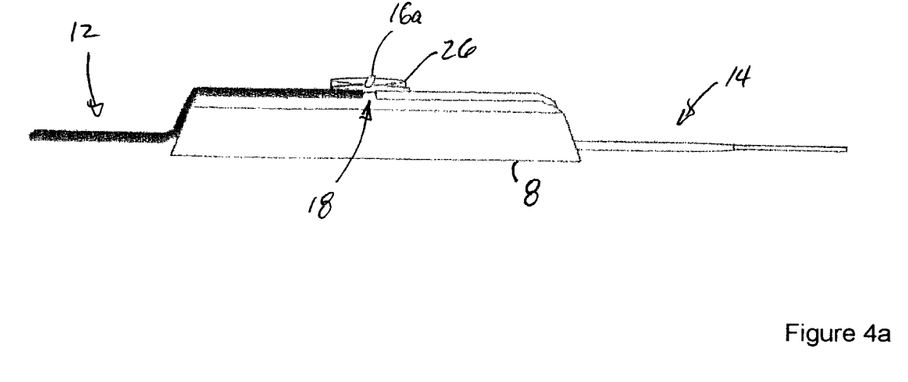
FIG. 4a is a front view of the junction of FIG. 4.

With respect to FIG. 4, in testing it was found that the angled side of distal end 16a of field generator 16 had a different polarity or otherwise was different as compared to the arrangements of field generator 16 shown in FIGS. 1-3. The angling of distal end 16a towards inputs 14a of outputs 14 was found to be more effective for changing the circuits, as switching the circuits through the various input and output lines 12 and 14 respectively, which were mounted on non-conductive base 8, was accomplished with greater ease. The offset point 16a of field generator 16 was aimed at inputs 14a so as to "push" or urge the plasma arc 20 where it needed to go, i.e., from outputs 12a to inputs 14a, thereby using less power and establishing the plasma arc 20 more quickly.

Figure 5A:
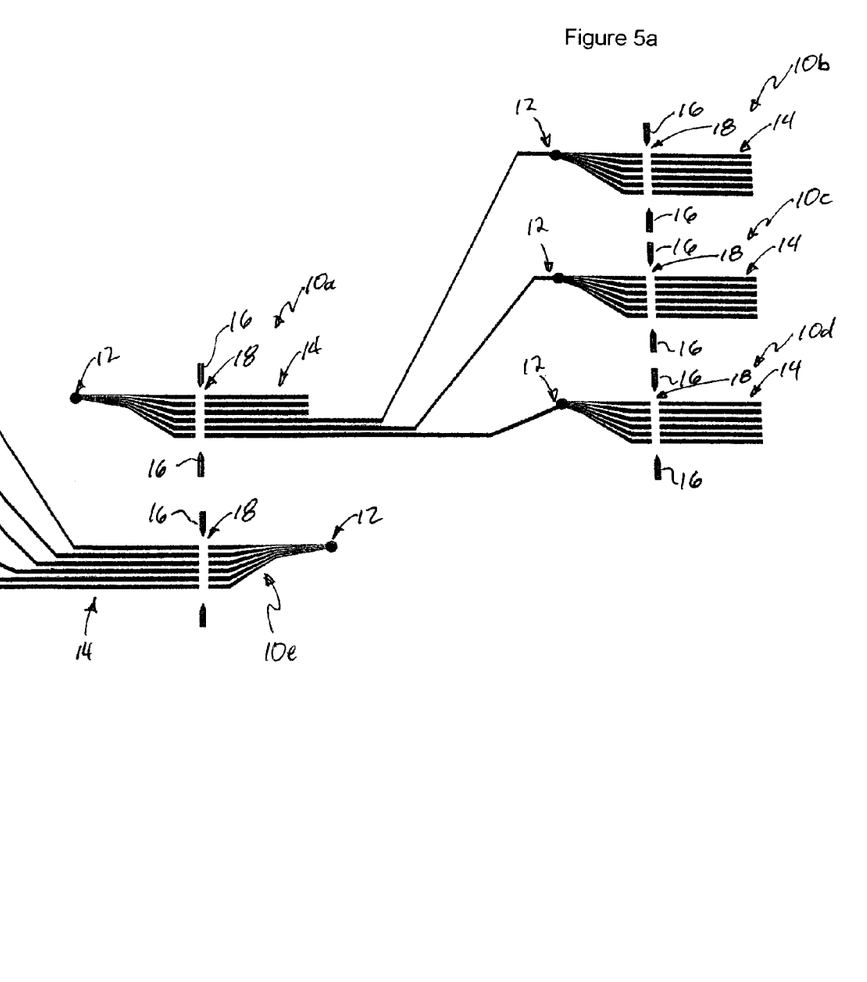
FIG. 5a is a network of circuit junctions wherein the plasma gate in the first junction has outputs that correspond to the inputs of the networked second junctions
Figure 5B:
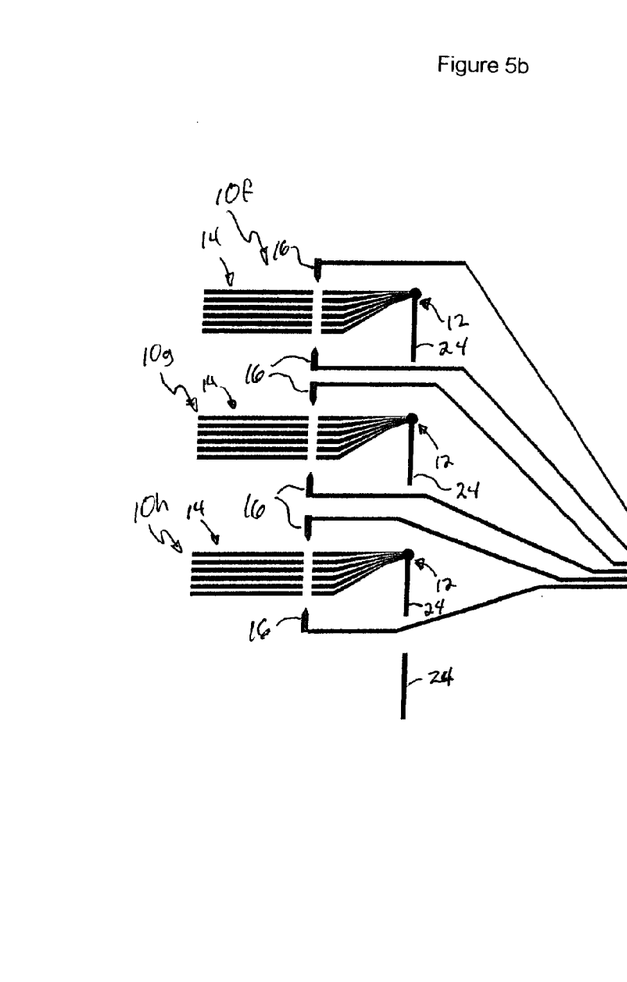
FIG. 5b is a network of circuit junctions wherein the plasma gate in the first junction has outputs that correspond to the field generators of the networked second junctions.
Figure 6:
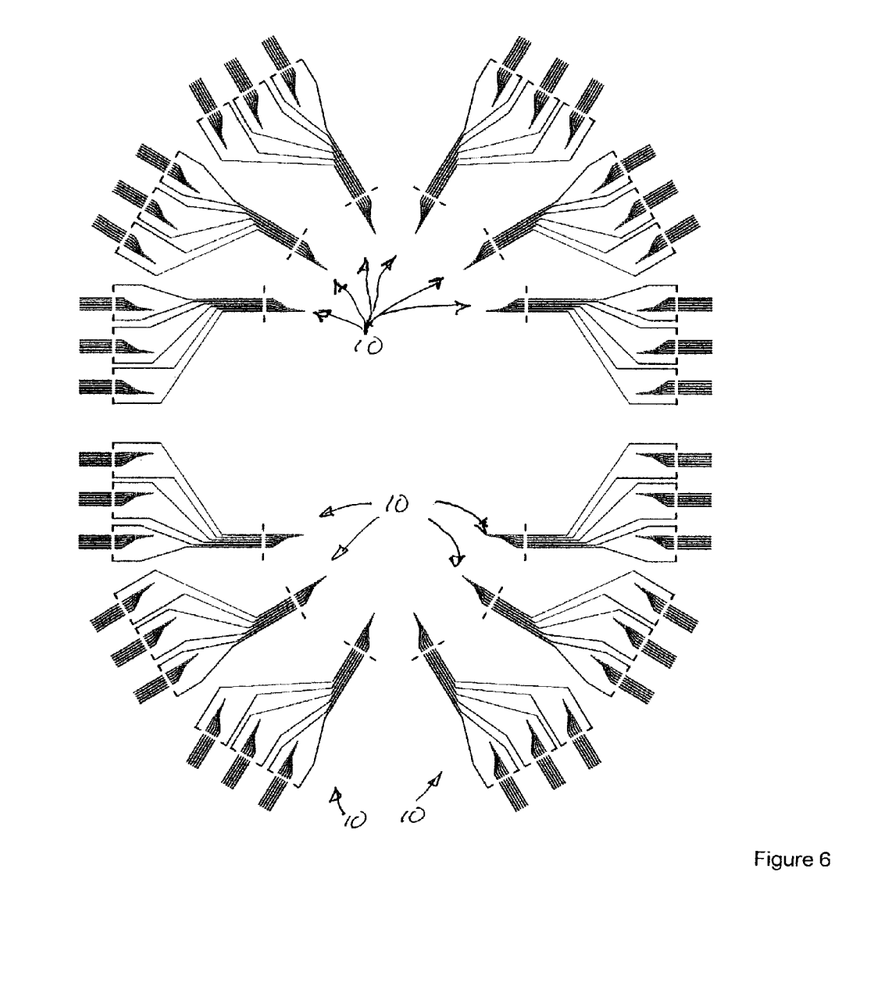
FIG. 6 is an array of the networked circuit junctions of FIG. 5b.

Systems such as seen in FIGS. 5a, 5b and 6 may be employed for switching by first junctions 10 amongst further arrays of junctions 10. Thus as seen in FIG. 5a, a first junction 10a, which is a version of the junction of FIG. 3 although this is not intending to be limiting, controls output to second junctions 10b, 10c, and 10d. Second junctions 10b, 10c and 10d themselves are each versions of the junction 20 of FIG. 3, although again this is not intended to be limiting as other junctions 10 will also work as is the case with junction 10a. Thus second junctions 10b, 10c, and 10d each switch their circuits (circuits inputs 12 and corresponding outputs 14) as controlled by their corresponding field generators 16. As will be understood, the outputs 14 from junction 10a may go to a lesser or greater number of second junctions being switched.

As seen in FIG. 5b, first junction 10e directs its outputs 14 not to the inputs 12 of second junctions 10f-10h, but to the inputs of the field generators 16 corresponding to second junctions 10f-10h. In the embodiment of FIG. 5b the output of junction 10e will, depending on the switch path closed by the operation of the field generators of junction 10e, control the switch path which is closed in the corresponding second junction 10f, 10g, or 10h. Pairs of output lines from junction 10e lead to corresponding single second junctions, that is, either to junction 10f, 10g or 10h. Each pair of output lines splits so that each output line of the pair powers or otherwise controls the field generated by a corresponding field generator from the opposed-facing pair of field generators on each of junctions 10f, 10g and 10h which control the circuits for a regulated power source 24. Thus it will be appreciated that at any one time, only the field generator on one side or the other of junctions 10f, 10g and 10h will be powered. Because power is supplied by power source 24 to all three of second junctions 10f, 10g, 10h, while the field generators for any one of these three second junctions is controlling/moving the position of the corresponding plasma arc 20, the plasma arcs in the other two second junctions remain stable and live. It will be understood that more than three second junctions may be employed.

FIG. 5b may be used for counting plus or minus, i.e., counting up or down (1, 2, etc.) as the circuits sub-divide into time sequences.

In FIG. 6 an array of the junction 10 circuits of FIG. 5b are provided to show how the sub-divided sequences may be employed. It is understood that one or more arrays of junctions 10 may be arranged concentrically outwardly (in a functional sense) of the illustrated array so that each output 14 branches to its own further junction 10 and so on creating a network of junctions.

If such a network was to form a building block of for example a digital processor, the sequence of inter-related connections within the network could be programmed, and if any one sequence became damaged for example, then the sequence could be re-routed without the damage impairing the functioning of the network. It is understood that the arrays of junctions 10 could network in three dimensions, and that gaps 18 could thus be two-dimensional gaps between a planar or other two-dimensional array of inputs 12 and a spaced apart, opposed-facing two-dimensional array of outputs 14.

Figure 7A:
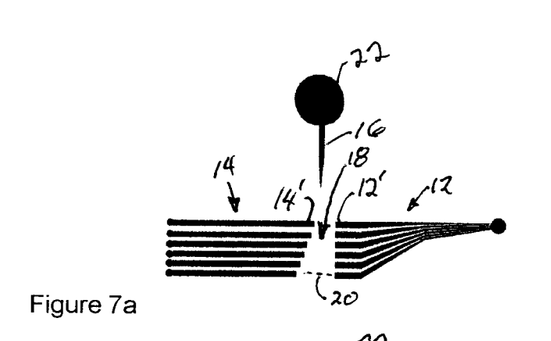
FIG. 7a is one embodiment of a plasma gate wherein a pointed field generator is driven by an energy burst device.
Figure 7B:
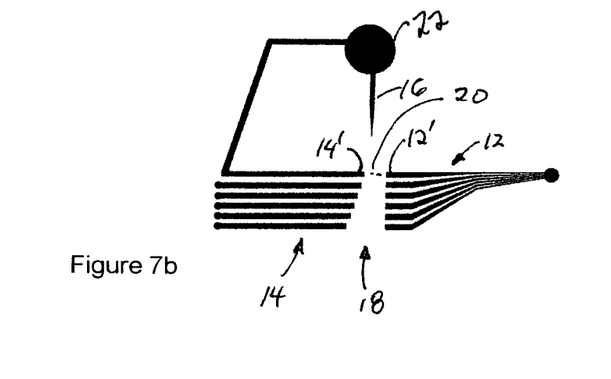
FIG. 7b is a further embodiment of the plasma gate of FIG. 7a wherein the energy burst device driving the field generator is charged by the plasma gate circuit when in its home position.

The plasma gate could be configured as a counting/time/hertz rate system such as seen in FIGS. 7 and 8. This could be done by using an energy bursting-type device 22 such as a capacitor that stores energy and then releases a burst of energy into the field generator 16, which may in one embodiment as seen in FIG. 8 be a coil-shaped field generator 16b. This energy could be controlled by means of using one of its own circuits or it could be energized by a different line or controlled by a separate device. This could be set up so that one burst would energize all the circuits, i.e. all of the individual input lines 12 and output lines 14, in a numerical sequence sequentially, that is, one at a time, and then return to the first circuit (i.e., the first input line 12' and corresponding first output line 14') representing zero. In FIG. 7a, energy bursting device 22 energizes a pointed field generator 16 such as used in the embodiment of FIG. 1. In FIG. 7b the energy bursting device 22 is charging when the closed circuit is between input 12' and output 14' as illustrated. Once device 22 is charged and releases its energy as a burst, plasma arc 20 is pushed away from filed generator 16, sequentially closing the circuits along plasma gap 18 in direction of the diverging of plasma gap 18. Once the energy has dispersed from device 22, the plasma arc 20 returns to its position 12', 14' closest to field generator 16 while device 22 again charges. The cycle repeats with a frequency which depends on the charge time and pulse time of device 22 and the response time for the plasma arc to return to the home position at 12', 14'. As seen in FIG. 8, advantageously a converging plasma gap 18 may be employed in conjunction with energy burst device 22 and its associated field generator 16b, as applicant has observed that a coil-shaped field generator is better at "pulling" plasma arc 20 towards the coil 16b than "pushing" plasma arc away from the coil 16b.

Of relevance to the present invention are the results of testing of a junction 10 using direct current in the presence of neon gas, wherein the neon gas and junction circuits were contained within a sealed vessel. The sealed vessel was breached with a hair-line crack allowing the escape of some of the neon gas and a small quantity of ambient air into the vessel, and in particular into the plasma gap. From the appearance of the plasma arc across the plasma gap it appeared to applicant that the mixed gas (ambient air mixed with neon gas) worked better. The line of the plasma arc became more pronounced and thinner. Applicant consequently surmises that this would likely allow for the voltage to be reduced to still produce a useful plasma arc.

With respect to the use of magnets 26, seen in FIG. 4, they are illustrated as merely one example of a means for controlling or lowering the voltage at the field generator. Other means for controlling or lowering the voltage may include coils, capacitors, etc., which then provide for more controlled switching amongst the circuits of junction 10.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A plasma gate comprising:
   at least one conductive input line having a corresponding at least one terminal end,
   a plurality of conductive output lines having a corresponding plurality of input ends,
   a plasma gap having opposite first and second ends, said plasma gap extending between said at least one terminal end and said plurality of input ends, wherein a plasma-generating gas is resident in said plasma gap,
   at least one field generator having a field-generating distal end mounted so as to position said distal end adjacent said plasma gap,
   wherein said plurality of conductive output lines are arrayed along said plasma gap in a spaced apart array, and said distal end is positioned at least at said first end of said plasma gap, wherein said plasma gap is elongate and wherein said at least one conductive input line is an array of conductive input lines and wherein consequently said at least one terminal end is a corresponding array of terminal ends corresponding to said array of conductive input lines, and wherein said plurality of input ends correspond to, and are substantially aligned with, said array of terminal ends.

2. The plasma gate of claim 1 wherein said plasma gap is substantially linear.

3. The plasma gate of claim 1 wherein said plasma gap has a second end opposite said first end, and wherein said plasma gap has a lateral width dimension which is not constant.

4. The plasma gate of claim 3 wherein said lateral width dimension of said plasma gap diverges.

5. The plasma gate of claim 4 wherein said at least one field generator is a single generator field at said first end of said plasma gap, and wherein said plasma gap said diverges so as to diverge from said first end to said second end.

6. The plasma gate of claim 1 wherein said at least one field generator includes a pair of field generators in opposed facing relation at said opposite ends of said plasma gap.

7. The plasma gate of claim 6 wherein said pair of field generators are substantially parallel.

8. The plasma gate of claim 6 wherein said at least one conductive input line is an array of conductive input lines and wherein consequently said at least one terminal end is a corresponding array of terminal ends corresponding to said array of conductive input lines, and wherein said plurality of input ends correspond to, and are substantially aligned with, said array of terminal ends.

9. The plasma gate of claim 1 wherein said gap has a center-line extending substantially equidistant between said at least one terminal end and said plurality of input ends, and wherein at least one said distal end of said at least one field generator is angled relative to said center-line.

10. The plasma gate of claim 9 wherein said at least one distal end is offset from said center-line.

11. A plasma gating method comprising:
 a) providing at least one conductive input line having a corresponding at least one terminal end,
 b) providing a plurality of conductive output lines having a corresponding plurality of input ends,
 c) providing a plasma gap having opposite first and second ends, said plasma gap extending between said at least one terminal end and said plurality of input ends, and providing a plasma-generating gas in said plasma gap,
 d) providing at least one field generator having a field-generating distal end mounted so as to position said distal end adjacent said plasma gap,
  wherein said plurality of conductive output lines are arrayed along said plasma gap in a spaced apart array, and said distal end is said positioned at least at said first end of said plasma gap,
 e) selectively creating a plasma arc across said plasma gap from said at least one terminal end to said plurality of input ends,
 f) creating a field from said at least one field generator,
 g) controlling said field so as to control a position of said plasma arc, wherein said plasma gap is elongate and wherein said at least one conductive input line is an array of conductive input lines and wherein consequently said at least one terminal end is a corresponding array of terminal ends corresponding to said array of conductive input lines, and wherein said plurality of input ends correspond to, and are substantially aligned with, said array of terminal ends.

12. The method of claim 11 said plasma gap is substantially linear.

13. The method of claim 11 wherein said plasma gap has a second end opposite said first end, and wherein said plasma gap diverges or converges.

14. The method of claim 13 wherein said at least one field generator is a single generator field at said first end of said plasma gap, and wherein said plasma gap said diverges or converges so as to, respectively, diverge or converge from said first end to said second end.

15. The method of claim 11 wherein said at least one field generator includes a pair of field generators in opposed facing relation at said opposite ends of said plasma gap.

16. The method of claim 15 wherein said pair of field generators are substantially parallel.

17. The method of claim 16 wherein said at least one conductive input line is an array of conductive input lines and wherein consequently said at least one terminal end is a corresponding array of terminal ends corresponding to said array of conductive input lines, and wherein said plurality of input ends correspond to, and are substantially aligned with, said array of terminal ends.

18. The method of claim 11 wherein said gap has a center-line extending substantially equidistant between said at least one terminal end and said plurality of input ends, and wherein at least one said distal end of said at least one field generator is angled relative to said center-line.

19. The method of claim 18 wherein said at least one distal end is offset from said center-line.

* * * * *